(12) United States Patent
Ramkumar et al.

(10) Patent No.: US 8,088,683 B2
(45) Date of Patent: Jan. 3, 2012

(54) SEQUENTIAL DEPOSITION AND ANNEAL OF A DIELECTIC LAYER IN A CHARGE TRAPPING MEMORY DEVICE

(75) Inventors: Krishnaswamy Ramkumar, San Jose, CA (US); Sagy Levy, Yaakov (IL)

(73) Assignee: Cypress Semiconductor Corporation, San Jose, CA (US)

( * ) Notice: Subject to any disclaimer, the term of this patent is extended or adjusted under 35 U.S.C. 154(b) by 292 days.

(21) Appl. No.: 12/080,166

(22) Filed: Mar. 31, 2008

(65) Prior Publication Data
US 2009/0243001 A1 Oct. 1, 2009

(51) Int. Cl.
*H01L 21/4763* (2006.01)
(52) U.S. Cl. ........ 438/593; 438/216; 438/261; 438/591; 438/594
(58) Field of Classification Search ................. 438/216, 438/261, 591, 593, 594
See application file for complete search history.

(56) References Cited

U.S. PATENT DOCUMENTS

| | | | |
|---|---|---|---|
| 4,395,438 A | 7/1983 | Chiang | |
| 4,490,900 A | 1/1985 | Chiu | |
| 4,870,470 A | 9/1989 | Bass et al. | |
| 5,408,115 A | 4/1995 | Chang | |
| 5,464,783 A | 11/1995 | Kim et al. | |
| 5,937,323 A | 8/1999 | Orczyk et al. | |
| 5,939,333 A | 8/1999 | Hurley et al. | |
| 5,972,765 A | 10/1999 | Clark et al. | |
| 5,972,804 A | 10/1999 | Tobin et al. | |
| 6,020,606 A | 2/2000 | Liao | |
| 6,023,093 A | 2/2000 | Gregor et al. | |
| 6,114,734 A | 9/2000 | Eklund | |
| 6,140,187 A | 10/2000 | DeBusk et al. | |
| 6,147,014 A | 11/2000 | Lyding et al. | |
| 6,150,286 A | 11/2000 | Sun et al. | |
| 6,162,700 A | 12/2000 | Hwang et al. | |
| 6,217,658 B1 | 4/2001 | Orczyk et al. | |
| 6,218,700 B1 | 4/2001 | Papadas | |
| 6,268,299 B1 | 7/2001 | Jammy et al. | |
| 6,297,173 B1 | 10/2001 | Tobin et al. | |
| 6,335,288 B1 | 1/2002 | Kwan et al. | |
| 6,348,380 B1 | 2/2002 | Weimer et al. | |
| 6,399,484 B1 | 6/2002 | Yamasaki et al. | |
| 6,406,960 B1 | 6/2002 | Hopper et al. | |
| 6,445,030 B1 | 9/2002 | Wu et al. | |
| 6,468,927 B1 | 10/2002 | Zhang et al. | |
| 6,559,026 B1 | 5/2003 | Rossman et al. | |
| 6,586,343 B1 | 7/2003 | Ho et al. | |
| 6,602,771 B2 | 8/2003 | Inoue et al. | |
| 6,661,065 B2 | 12/2003 | Kunikiyo | |

(Continued)

OTHER PUBLICATIONS

USPTO Non-Final Rejection for U.S. Appl. No. 11/904,475 dated Apr. 27, 2010; 12 pages.

(Continued)

*Primary Examiner* — Long K Tran

(57) ABSTRACT

Deposition and anneal operations are iterated to break a deposition into a number of sequential deposition-anneal operations to reach a desired annealed dielectric layer thickness. In one particular embodiment, a two step anneal is performed including an $NH_3$ or $ND_3$ ambient followed by an $N_2O$ or $NO$ ambient. In one embodiment, such a method is employed to form a dielectric layer having a stoichiometry attainable with only a deposition process but with a uniform material quality uncharacteristically high of a deposition process. In particular embodiments, sequential deposition-anneal operations provide an annealed first dielectric layer upon which a second dielectric layer may be left substantially non-annealed.

17 Claims, 6 Drawing Sheets

U.S. PATENT DOCUMENTS

| | | | |
|---|---|---|---|
| 6,670,241 | B1 | 12/2003 | Kamal et al. |
| 6,677,213 | B1 | 1/2004 | Ramkumar et al. |
| 6,709,928 | B1 | 3/2004 | Jenne et al. |
| 6,713,127 | B2 | 3/2004 | Subramony et al. |
| 6,768,160 | B1 | 7/2004 | Li et al. |
| 6,818,558 | B1 | 11/2004 | Rathor et al. |
| 6,884,681 | B1 | 4/2005 | Kamal et al. |
| 6,906,390 | B2 | 6/2005 | Nomoto et al. |
| 6,913,961 | B2 | 7/2005 | Hwang |
| 7,012,299 | B2 | 3/2006 | Mahajani et al. |
| 7,042,054 | B1 | 5/2006 | Ramkumar et al. |
| 7,372,113 | B2 | 5/2008 | Tanaka et al. |
| 7,479,425 | B2 * | 1/2009 | Ang et al. ............ 438/257 |
| 2006/0160303 | A1 * | 7/2006 | Ang et al. ............ 438/257 |
| 2006/0192248 | A1 | 8/2006 | Wang |
| 2008/0290399 | A1 * | 11/2008 | Levy et al. ............ 257/324 |
| 2009/0302365 | A1 * | 12/2009 | Bhattacharyya ......... 257/298 |

OTHER PUBLICATIONS

PCT International Search Report and Written Opinion of the International Searching Authority, PCT/US07/20965 filed Sep. 28, 2007, mailed Apr. 21, 2008.

USPTO Notice of Allowance for U.S. Appl. No. 10/740,205 dated Jun. 15, 2005; 6 pages.

USPTO Final Rejection for U.S. Appl. No. 10/740,205 dated Mar. 22, 2005; 8 pages.

USPTO Non-Final Rejection for U.S. Appl. No. 10/740,205 dated Jun. 29, 2004; 5 pages.

USPTO Notice of Allowance for U.S. Appl. No. 09/920,378 dated Nov. 10, 2003; 5 pages.

USPTO Advisory Action for U.S. Appl. No. 09/920,378 dated Sep. 5, 2003; 3 pages.

USPTO Advisory Action for U.S. Appl. No. 09/920,378 dated Jun. 25, 2003; 3 pages.

USPTO Final Rejection for U.S. Appl. No. 09/920,378 dated Mar. 28, 2003; 6 pages.

USPTO Non-Final Rejection for U.S. Appl. No. 09/920,378 dated Oct. 21, 2002; 10 pages.

USPTO Requirement Restriction for U.S. Appl. No. 09/920,378 dated Jul. 22, 2002; 4 pages.

USPTO Notice of Allowance for U.S. Appl. No. 10/185,470 dated Jul. 16, 2004; 4 pages.

USPTO Non-Final Rejection for U.S. Appl. No. 10/185,470 dated Oct. 16, 2003; 7 pages.

USPTO Non-Final Rejection for U.S. Appl. No. 10/185,470 dated Feb. 24, 2004; 6 pages.

USPTO Notice of Allowance for U.S. Appl. No. 10/094,108 dated Aug. 22, 2003; 5 pages.

USPTO Non-Final Rejection for U.S. Appl. No. 10/094,108 dated Mar. 31, 2003; 8 pages.

USPTO Requirement Restriction for U.S. Appl. No. 10/094,108 dated Dec. 3, 2002; 4 pages.

Ohring, M., Materials Science of Thin Films, 2nd ed. Academic, 2002, pp. 336-337.

USPTO Final Rejection for U.S. Appl. No. 11/904,475 dated Sep. 28, 2010; 14 pages.

USPTO Requirement for Restriction for U.S. Appl. No. 11/904,475 dated Jan. 8, 2010; 8 pages.

USPTO Advisory Action for U.S. Appl. No. 11/904,475 dated Nov. 24, 2010; 3 pages.

USPTO Non-Final for U.S. Appl. No. 11/904,475 dated Apr. 12, 2011; 14 pages.

* cited by examiner

US 8,088,683 B2

SEQUENTIAL DEPOSITION AND ANNEAL OF A DIELECTRIC LAYER IN A CHARGE TRAPPING MEMORY DEVICE

TECHNICAL FIELD

The invention is in the field of semiconductor devices, more specifically pertaining to non-volatile charge trap memory devices, such as SONOS devices.

BACKGROUND

FIG. 1A illustrates a cross-sectional view of a conventional non-volatile charge trap memory device where an oxide-nitride-oxide (ONO) stack is used to store charge in a nitride layer having a high density of charge trap states, forming a semiconductor-oxide-nitride-oxide-semiconductor (SONOS) transistor. In functional terms, the first "Semiconductor" refers to the channel region of the substrate, the first "Oxide" refers to the tunneling layer, "Nitride" refers to the charge trapping layer, the second "Oxide" refers to the blocking layer and the second "Semiconductor" refers to the gate layer. The charge stored in the nitride trapping layer enables a SONOS transistor to provide non-volatility memory (NVM).

As further shown in FIG. 1A, non-volatile charge trap memory device 100 includes a SONOS gate stack 104 including a conventional ONO portion 106 formed over a silicon substrate 102. Non-volatile charge trap memory device 100 further includes source and drain regions 110 on either side of SONOS gate stack 104 to define a channel region 112. SONOS gate stack 104 includes a poly-silicon gate layer 108 formed above and in contact with ONO portion 106. Poly-silicon gate layer 108 is electrically isolated from silicon substrate 102 by ONO portion 106. ONO portion 106 typically includes an oxide tunneling layer 106A, a nitride or oxynitride charge trapping layer 106B, and an oxide blocking layer 106C overlying charge trapping layer 106B.

One limitation of conventional SONOS transistors is quality of the dielectric employed for the charge trapping layer 106B. While a poor quality dielectric provides a beneficially high density of trap states for charge storage, the poor quality dielectric is detrimentally leaky and unable to retain the trapped charge. This leakage limits the retention time of the charge trap memory device. It is desirable to selectively tailor the quality of the charge trapping layer 106B in a manner that provides a density of trap states sufficient for charge storage and a reduced rate of trapped charge leakage.

A conventional method for forming the ONO portion 106 of FIG. 1A is shown in FIG. 1B. In operation 151, the tunneling layer is grown by a thermal oxidation from the silicon substrate. A high quality silicon dioxide layer may be produced with such a process. Then, at operation 152, to form an oxynitride charge trapping layer, a low pressure chemical vapor deposition (LPCVD) process is employed while a similar deposition process is typically used at operation 153 to form a blocking layer. In an LPCVD deposition, the quality of the deposited layer is typically limited by the non-equilibrium deposition mode. Thus, even when deposition conditions are tuned in an effort to deposit a good quality oxynitride layer, there is still a significant quantity of hydrogen and non-terminated bonds within the layer.

BRIEF DESCRIPTION OF THE DRAWINGS

Embodiments of the present invention are illustrated by way of example, and not limitation, in the figures of the accompanying drawings in which.

DETAILED DESCRIPTION

Embodiments of a non-volatile charge trap memory device are described herein with reference to figures. In accordance with one embodiment of the present invention, the non-volatile trapped-charge memory device is a SONOS-type device wherein a charge trapping layer is an insulator layer, such as a silicon nitride or silicon oxynitride ($Si_xO_yN_z$). In another embodiment, the non-volatile trapped-charge memory device is a Flash-type device wherein the charge trapping layer is a conductor layer or a semiconductor layer, such as poly-silicon. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1A:
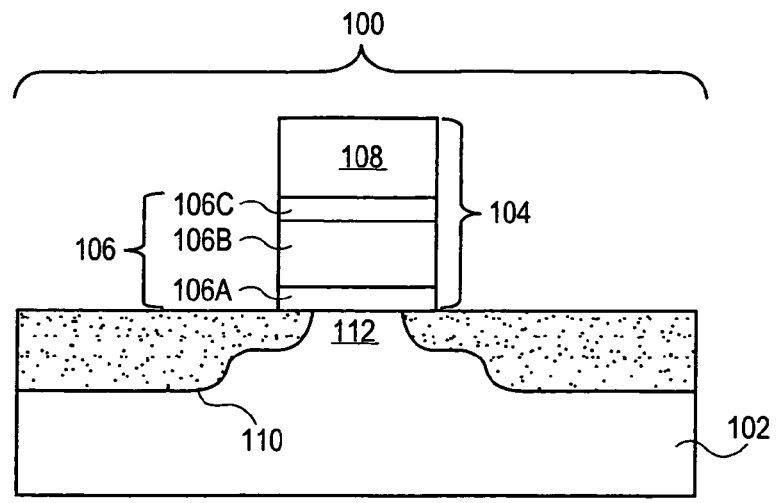
FIG. 1A illustrates a cross-sectional view of a conventional SONOS non-volatile charge trap memory device.
Figure 1B:
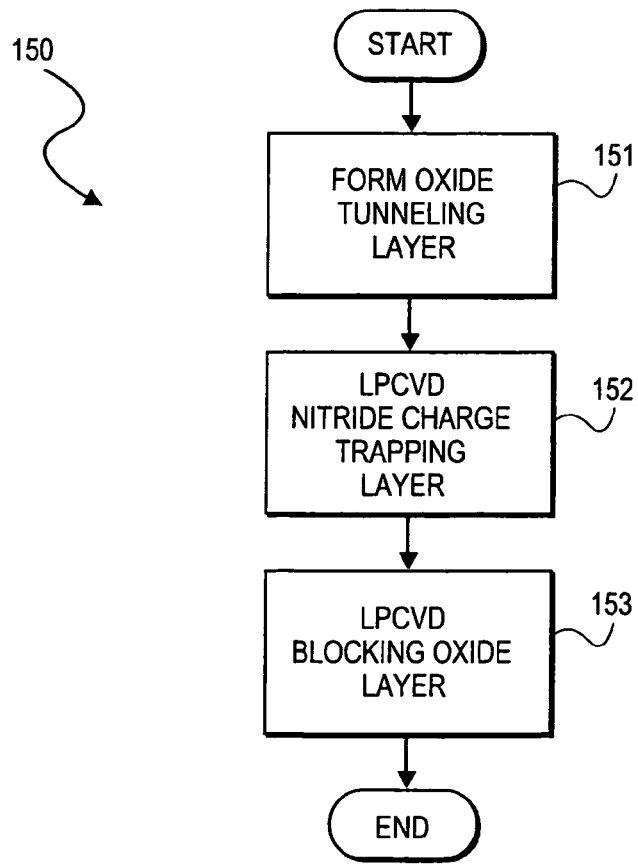
FIG. 1B illustrates a general method of forming the conventional ONO portion of the SONOS non-volatile charge trap memory device depicted in FIG. 1A.
Figure 2:
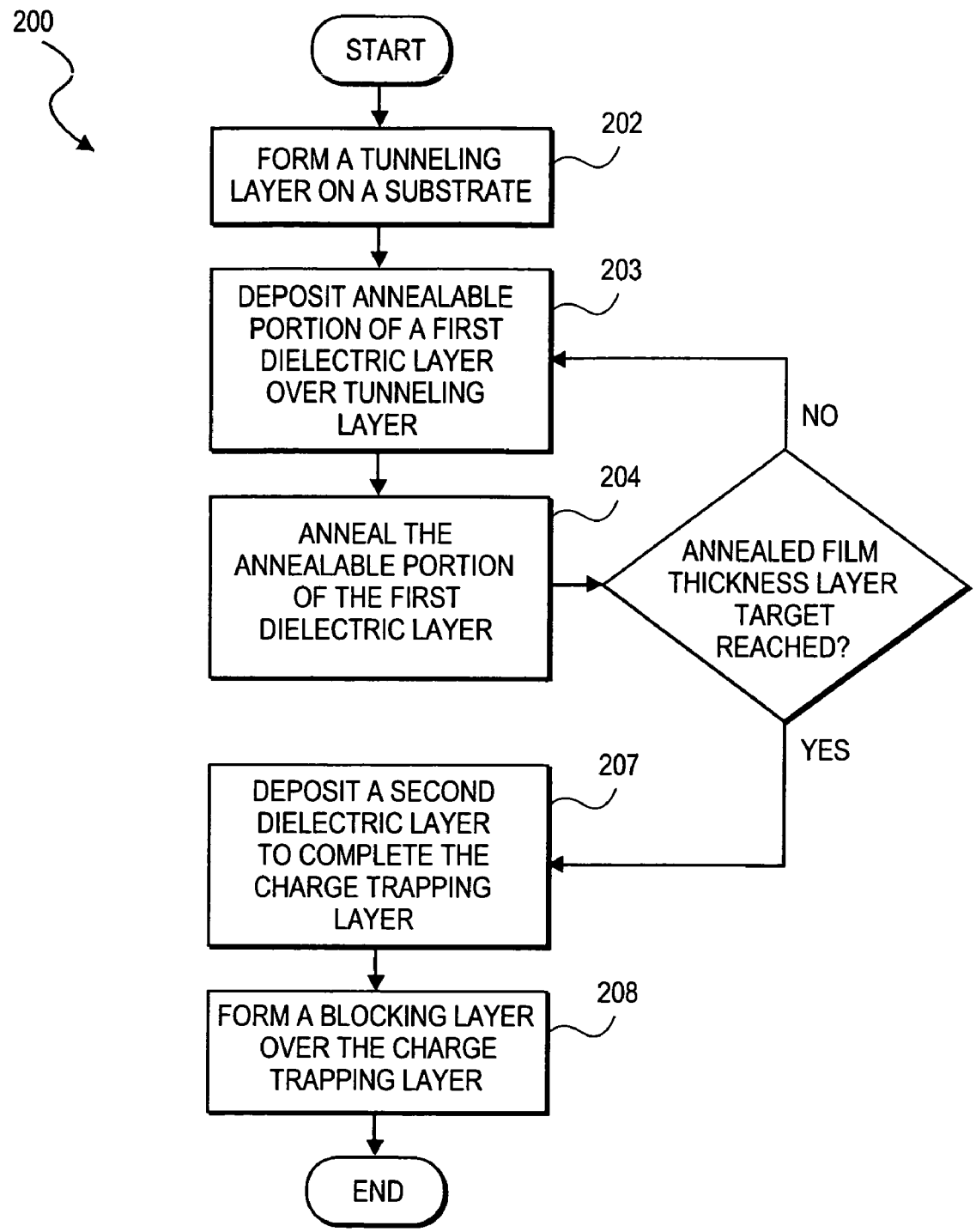
FIG. 2 illustrates a flow diagram depicting sequences of particular operations to iteratively deposit and anneal a portion of a charge trapping layer, in accordance with particular embodiments of non-volatile charge trap memory device of the present invention.

FIG. 2 illustrates a flow diagram, generally depicting a series of operations employed in the fabrication method 200 of a non-volatile charge trap memory device, in accordance with particular embodiments of the present invention. Operations are to be understood as consisting one or more fabrication processes, each requiring one or more piece of semiconductor processing equipment.

Method 200 begins at operation 202 with formation of a dielectric layer on a semiconductor substrate to functionally serve as a tunneling layer for a non-volatile charge trap memory device, such as a SONOS device. Subsequently, at operation 203, an "annealable portion" of a first dielectric layer is deposited over the tunneling layer. An "annealable portion" is used herein to refer to a functional thickness of a deposited film which may be efficiently annealed. Because diffusion into and out of the layer is limited by film thickness, anneal times scale nonlinearly with thickness and therefore become less efficient. The approximate thickness of an annealable portion is dependent on a diffusion distance of a particular species in a particular dielectric material at a particular temperature and pressure. For example, for diffusion of a nitrogen species through a silicon oxynitride dielectric at a temperature of about 800° C. and a pressure around 500 mTorr, the diffusion distance is on the order of 1.0 nm to 1.5 nm. Thus, in this example, the annealable portion of an oxynitride layer is about 1.0 nm to 1.5 nm. For other species, such as hydrogen, the annealable portion of an oxynitride layer would be somewhat greater.

Next, at operation 204, the annealable portion of the first dielectric layer is annealed to improve the quality of the deposited first dielectric layer. The anneal improves the quality of the deposited first dielectric layer by reducing the number of trap states, non-terminated bonds and hydrogen species present in the first dielectric layer "as-deposited." Next, if the thickness of the annealed first dielectric layer is not at a target thickness, deposition operation 203 is repeated wherein a second annealable portion of the first dielectric layer is deposited on the annealed portion previously formed, thereby thickening the first dielectric layer over the tunneling layer. Anneal operation 204 may then be repeated to anneal the second annealable portion of the first dielectric layer.

In this manner, deposition operation 203 and anneal operation 204 may be iterated to break a deposition into a number of sequential deposition-anneal operations performed as pairs to reach a desired annealed dielectric layer thickness. Such a method may be employed to form a dielectric layer having a stoichiometry attainable with only a deposition process but with a uniform material quality uncharacteristically high of a deposition process. It has been found that employing a sequential deposition-anneal-deposition-anneal process yields a dielectric with a considerably higher breakdown voltage (BV) than for a film formed without such a treatment. For example, a baseline of as-deposited dielectric provided a BV of about 6.1 V while a deposition-anneal process employing a 5 minute anneal yielded a BV of about 7.3 V. Similarly, a flat band voltage decay rate (Vfb) was found to be reduced by approximately 30-40% for the sequential deposition-anneal treatment.

The combination of attributes of a sequentially deposited-annealed dielectric material is advantageous for an interface material between a tunneling layer and a charge trapping layer of a charge trap memory device. The interface material keeps stored charge away from the substrate while still providing a transition from the low trap density of a thermally grown silicon dioxide tunneling layer to a high trap density of a deposited silicon oxynitride charge trapping layer. Additionally, the series of deposition-anneal sequences may be more efficient than first depositing a layer to a thickness greater than the diffusion distance and then annealing because annealing a layer of a thickness significantly greater than the diffusion distance can be expected to require a processing time significantly longer than a sum of anneal process times of the iterated anneal operation 204.

As further shown in FIG. 2, once the annealed layer thickness meets the targeted thickness, iteration of the deposition-anneal sequence is terminated. In the depicted embodiment, method 200 then proceeds to operation 207 where a second dielectric layer is deposited to complete the charge trapping layer. The second dielectric layer may be deposited under conditions optimized for a low quality dielectric having a high density of traps and non-terminated bonds which is beneficial for holding a large quantity of charge. In particular embodiments, since the first dielectric is layer fully annealed, the second dielectric layer may be left substantially non-annealed, in the as-deposited state to retain the highest density of trap states. In this manner, annealing of one portion of the stack (e.g. interface of the tunneling layer and charge trapping layer) is without detriment to another portion (e.g. trap centroid within the thickness of non-annealed portion of the charge trapping layer).

Concluding method 200, a blocking layer is formed on the charge trapping layer 208 to complete an ONO stack of a charge trap memory device, such as a SONOS transistor. With the general method described, specific implementations are now described in more detail with reference to additional figures.

Figure 3:
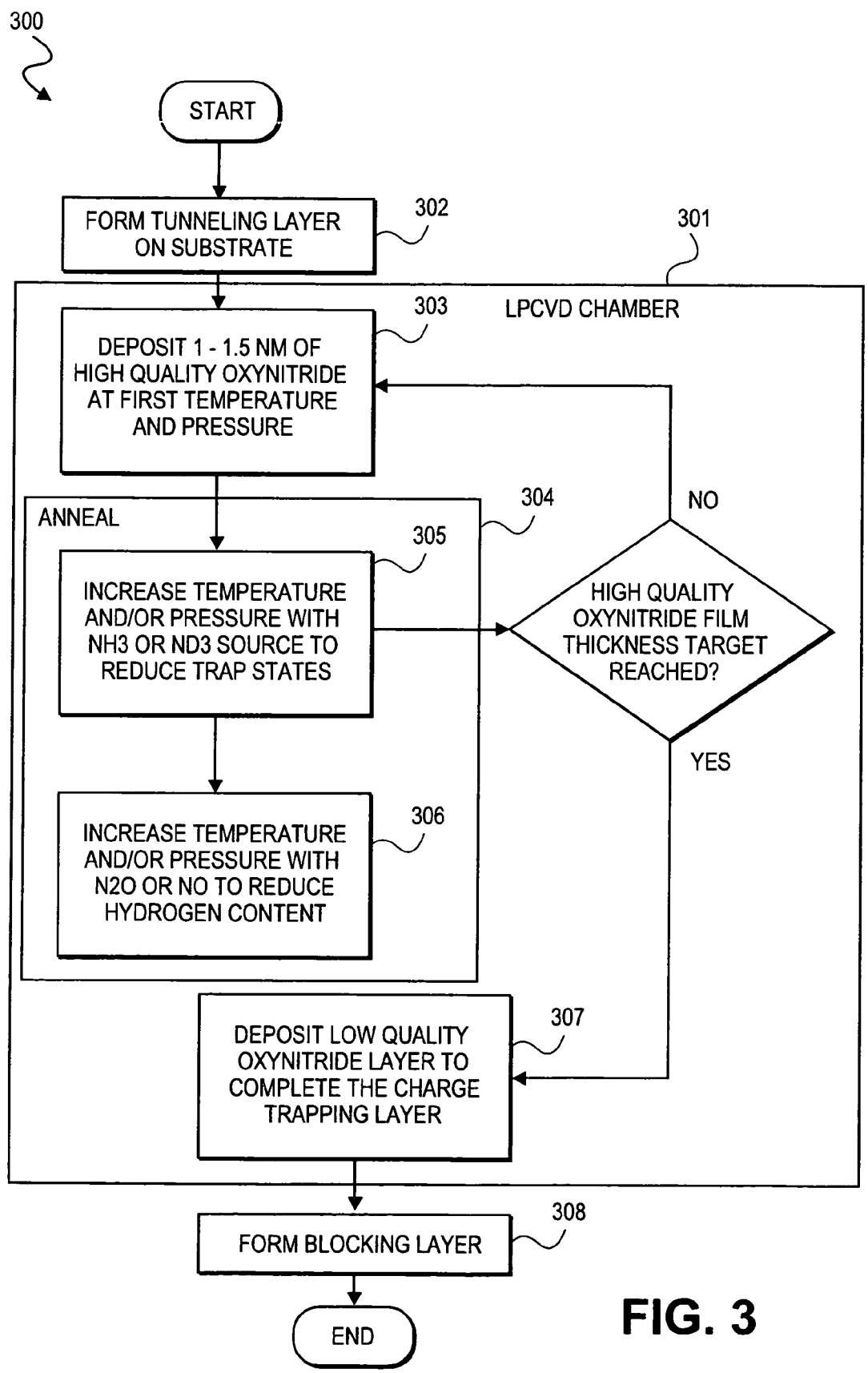
FIG. 3, illustrates a illustrate a flow diagram representing operations of an annealing process to form a high quality oxygen-rich silicon oxynitride layer and a low quality, non-annealed silicon-rich silicon oxynitride layer to form a multi-layered charge trapping layer, in accordance with particular embodiments of the present invention.
Figure 4A:
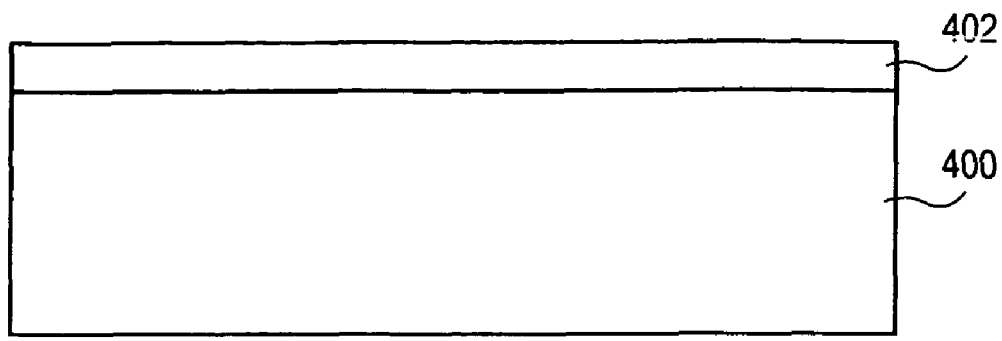
FIG. 4A illustrates a cross-sectional view representing operations in the formation of a semiconductor structure in which a tunneling layer is formed on a semiconductor substrate, in accordance with an embodiment of the present invention.

As depicted in FIG. 3, method 300 begins with formation of the tunneling layer on a substrate at operation 302. As further depicted in FIG. 4A, substrate 400 may be composed of any material suitable for semiconductor device fabrication.

In one embodiment, substrate 400 is a bulk substrate comprised of a single crystal of semiconductor material which may include, but is not limited to, silicon, germanium, silicon/germanium or a III-V compound semiconductor material. In another embodiment, substrate 400 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In still another embodiment, substrate 400 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxynitride. The lower bulk layer is comprised of a amorphous, polycrystalline or single crystal material which may include, but is not limited to, silicon, germanium, silicon/germanium, a III-V compound semiconductor material and quartz.

Tunneling layer 402 may be composed of a material and have a thickness suitable to allow charge carriers to tunnel into the charge trapping layer under an applied gate bias, while maintaining a suitable barrier to leakage when a non-volatile charge trap memory device is unbiased. In certain embodiments, tunneling layer 402 is a commonly known dielectric layer, such as silicon dioxide ($SiO_2$), a silicon oxynitride ($SiO_xN_y(H_z)$), a silicon dioxide that is subsequently nitridized, or a stack dielectric made of silicon dioxide and silicon nitride ($Si_3N_4$). It should be appreciated that because silicon is implicitly present in conventional silicon-based microelectronic fabrication processing, it is customary in the art to simply refer to "silicon oxynitride" as "oxynitride" and silicon nitride as "nitride," etc.

In accordance with an embodiment of the present invention, tunneling layer 402 is formed by an oxidation process where the top surface of substrate 400 is consumed to form tunneling layer 402. For example, in one embodiment, substrate 400 is composed of silicon and tunneling layer 402 is composed of silicon dioxide. The tunneling layer may have a physical thickness of between about 1.5 nm and 3.0 nm. Tunneling layer 402 may be formed by any oxidation process convention in the art. For example, wet or dry oxidation process may be employed at a temperature approximately in the range of 950-1100° C.

Figure 4B:
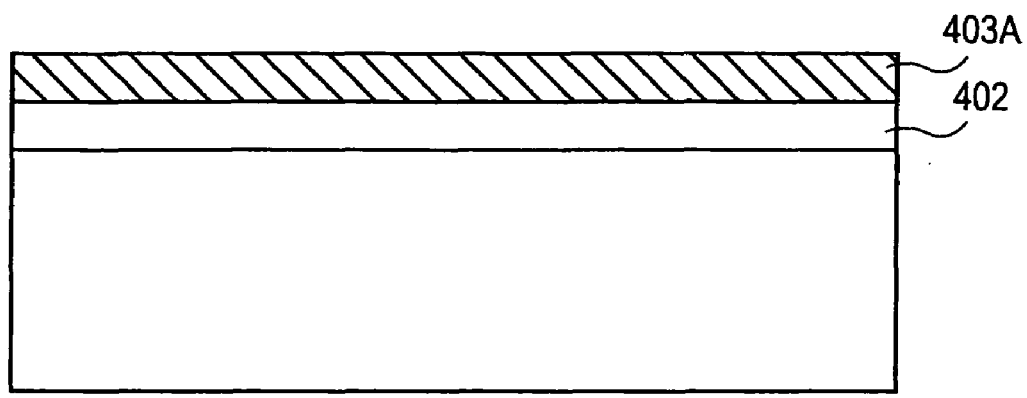
FIG. 4B illustrates a cross-sectional view representing operations in the formation of a semiconductor structure in which a first thickness of a dielectric material is deposited on the tunneling layer, in accordance with an embodiment of the present invention.

FIG. 4B illustrates a cross-sectional view of a first dielectric material 403A formed on the tunneling layer 402, corresponding to operation 303 of FIG. 3. The first dielectric material 403A has a composition distinct from that of the tunneling layer 402. The first dielectric material 403A may include, but is not limited to, silicon nitride, silicon oxynitride, oxygen-rich silicon oxynitride or silicon-rich silicon oxynitride. In one embodiment, the first dielectric material 403A functionally serves as a portion of a charge trapping layer. In another embodiment, the first dielectric material 403A functionally serves as barrier to charge loss from a subsequently formed charge trapping layer to the substrate 400.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt % of silicon and oxygen (i.e. reduction of nitrogen). An oxygen-rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt % of silicon with less oxygen than an "oxygen-rich" film. A silicon-rich silicon oxynitride film is therefore more like silicon and the RI is increased toward the 3.5 RI of pure silicon.

In a specific embodiment, the first dielectric material 403A comprises an oxygen-rich silicon oxynitride layer. The oxygen-rich stoichiometry of the first dielectric material 403A, being more like silicon dioxide relative to silicon nitride, provides a good quality interface with tunneling layer 402. In one such embodiment, the composition of the oxygen-rich oxynitride results in the first dielectric material 403A having a RI in the range of 1.7 and 1.9, preferably about 1.8, as deposited, with an annealable thickness of between approximately 1.0 nm and approximately 1.5 nm in preparation for an efficient anneal.

It will be appreciated by one of ordinary skill in the art that such RI measurements become highly accurate with current assay techniques only when a film has a thickness of at least 20 nm, which is substantially thicker than the film thickness employed in a charge trap memory device, such as a SONOS transistor. The RI, therefore, may be measured on a film deposited with the same method as that employed to for the charge trapping layer(s), but for a longer process time to produce a thicker film enabling a more accurate measurement. Nonetheless, it is to be understood that the RI values provided herein, while best measured on bulk films of at least 20 nm in thickness, are well correlated with the composition of the dielectric materials deposited to lesser thicknesses described herein.

In a particular embodiment, the oxygen-rich stoichiometry of the first dielectric material 403A is deposited with a batch or single-wafer LPCVD chamber 301 of FIG. 3. The LPCVD process may employ gases such as, but not limited to, dichlorosilane ($H_2SiCl_2$), bis-(tert-butylamino)silane (BTBAS), ammonia ($NH_3$) or nitrous oxide ($N_2O$). Just as the term "oxygen-rich" is relative to a stoichiometric $Si_3N_4$ material, the formation process of an "oxygen-rich" material may also be characterized based on the 3:1 volumetric flow rate ratio, $SiH_2Cl_2:NH_3$, commonly employed to produce a stoichiometric ($Si_3N_4$) with a CVD method. The oxygen-rich oxynitride film is therefore formed with a relatively higher volumetric flow rate of oxidizer (e.g. $N_2O$) than used for the silicon-rich oxynitride film. In certain embodiments, the first dielectric material 403A may be formed at a temperature less than the temperature used to form the tunneling layer 402.

In a specific batch processing implementation, an oxygen-rich oxynitride film is formed by introducing a process gas mixture including $N_2O$, $NH_3$ and $SiH_2Cl_2$, while maintaining the chamber at a pressure approximately in the range of 200-500 mTorr, and maintaining substrate 400 at a temperature approximately in the range of 700-850° C., for a period approximately in the range of 2.5-20 minutes. In one such embodiment, the process gas mixture includes $N_2O$ and $NH_3$ at a high volumetric flow rate ratio of about 1:1 to about 3:1 $N_2O:NH_3$, while the $SiH_2Cl_2$ to $NH_3$ is also at a high volumetric flow rate ratio from about 3.5:1 to 8:1 $SiH_2Cl_2:NH_3$. In a preferred embodiment, the $N_2O:NH_3$ ratio is about 2:1, while the $SiH_2Cl_2:NH_3$ is at a ratio of about 6:1. The gases may be introduced at a flow rate approximately in the range of 5-200 standard cubic centimeters per minute (sccm). In alternative embodiments, single wafer LPCVD chambers commercially available may be employed with suitable process conditions for an oxygen-rich oxynitride of high quality. Such conditions may be readily determined by one of ordinary skill in the art based on the conditions provided by for a batch process.

Following deposition of the first thickness of the first dielectric material 403A, anneal operation 304 is performed on the first dielectric material 403A. Generally, the anneal exposes the first dielectric material 403A to a passivating species at a sufficient temperature, pressure and time to passivate trap states, non-terminated bonds and hydrogen incorporated during the deposition of the first dielectric material 403A.

In one embodiment, the anneal operation 304 is performed with at least one of a higher temperature or higher pressure than that employed for the deposition of the first dielectric material 403A at operation 303. For example, for an embodiment where the first dielectric material 403A is deposited at a temperature approximately in the range of 700-800° C., the anneal operation 304 may be performed at a temperature approximately in the range of 800-825° C. In another implementation where first dielectric material 403A is deposited at a process pressure approximately in the range of 200-300 mTorr, the process pressure of the anneal operation 304 may be increased to be approximately in the range of 500 mTorr-2 Torr. In still other embodiments, both the temperature and pressure of the anneal are similarly incremented above the parameters at which the first dielectric material 403A is deposited.

Because the first thickness of the first dielectric material 403A was limited to between approximately 1.0 nm and 1.5 nm, the anneal operation 304 may be of short duration. For example, the anneal operation 304 may be performed for a duration approximately in the range of 30-60 seconds for a single substrate apparatus or approximately in the range of 5-20 minutes in a batch processing furnace. It will be appreciated that even batch processing furnaces are capable of quickly ramping temperatures for anneal processes because no deposition is to occur.

The anneal ambient may include, a gas such as, but not limited to, nitrogen ($N_2$), nitrous oxide ($N_2O$), nitrogen dioxide ($NO_2$), nitric oxide (NO), ammonia ($NH_3$), or deuterated ammonia ($ND_3$). In the particular embodiment depicted in FIG. 4, a two step anneal is performed as part of the anneal operation 304. First, an $NH_3$ or $ND_3$ atmosphere is provided at anneal operation 305 to reduce the silicon-rich sites normally present in deposited silicon oxynitride. Silicon-rich sites will typically include dangling bonds within an oxide-silicon interface that may bond to atomic hydrogen (H) or deuterium (D). Then, at anneal operation 306, an $N_2O$ or NO ambient is provided to reduce hydrogen content in the first thickness of the first dielectric material 403A. Embodiments with an NO ambient are advantageous for reducing the amount the first dielectric material 403A will reoxidize. In such multi-step anneal embodiments, the duration of each anneal operation (405 and 406) is approximately in the range of 30 seconds to 60 seconds for a single substrate apparatus or approximately in the range of 5 minutes to 20 minutes in a batch processing apparatus. Because deuterium in particular cannot readily diffuse through silicon nitride, limiting the first thickness of the first dielectric layer to less than 1.5 nm is particularly important to enable such short anneal durations.

In a further embodiment, the $NH_3$ or $ND_3$ atmosphere provided in anneal operation 305 is at a higher temperature, higher pressure, or both higher temperature and higher pressure, than that employed in the deposition operation 303.

Similarly, the $N_2O$ atmosphere may be provided in anneal operation 306 at a higher temperature, higher pressure, or both higher temperature and higher pressure than that employed in the anneal operation 305.

Figure 4C:
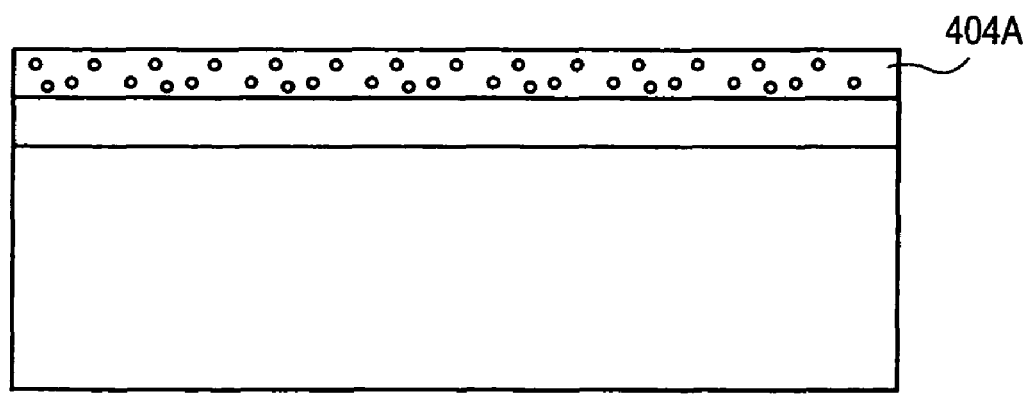
FIG. 4C illustrates a cross-sectional view representing operations in the formation of a semiconductor structure in which the first deposited thickness of the dielectric material is annealed, in accordance with an embodiment of the present invention.

In embodiments employing an $ND_3$ anneal, deuterium is incorporated into the first thickness of first dielectric material 403A to render a deuterated layer 404A, as depicted in FIG. 4C. Because the first thickness was limited to an annealable thickness (e.g. less than 1.5 nm), the level of deuterium incorporation may be much higher than for films which may have deuterium merely as a result of diffusion from an external source of deuterium, such as a subsequent deuterium anneal performed after a full SONOS stack is formed.

Figure 4D:
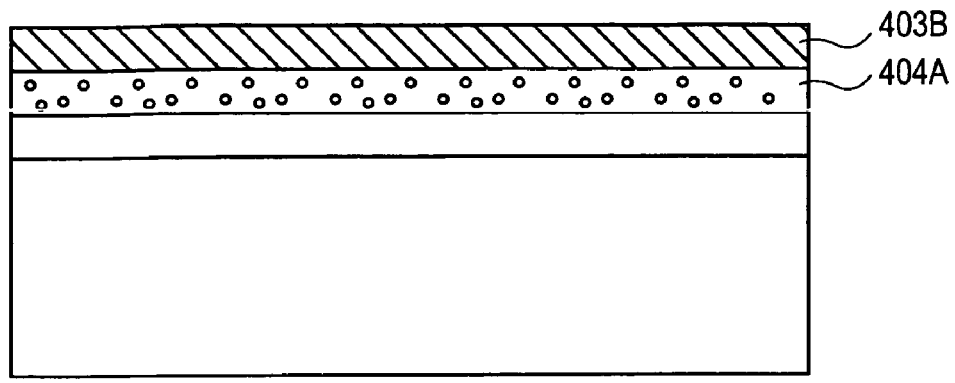
FIG. 4D illustrates a cross-sectional view representing operations in the formation of a semiconductor structure in which a second thickness of the a dielectric material is deposited on the annealed dielectric layer, in accordance with an embodiment of the present invention.
Figure 4E:
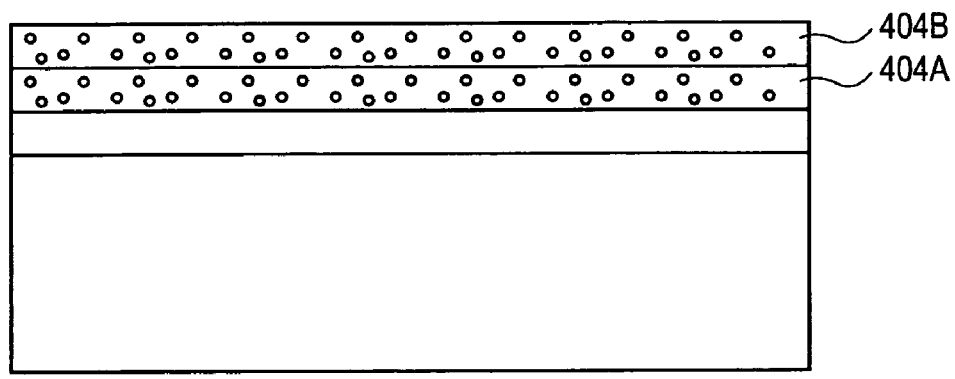
FIG. 4E illustrates a cross-sectional view representing operations in the formation of a semiconductor structure in which the second deposited thickness of a dielectric material is annealed, in accordance with an embodiment of the present invention.

Following the anneal, as shown in FIG. 4D, an annealable thickness of a second dielectric material 403B is deposited on the first thickness of first dielectric material 403A. The composition of the second dielectric material 403B may be the same as that of first dielectric material 403A to increase the thickness of the first dielectric material 403A beyond that of the first iteration of deposition and anneal. In one such embodiment, deposition operation 303 of FIG. 3 is repeated to deposit a second annealable thickness of oxygen-rich silicon oxynitride. This second annealable thickness may again be between approximately 1.0 nm and approximately 1.5 nm in preparation for an efficient anneal, just as for the first thickness of first dielectric material 403A. In an alternate embodiment, the second dielectric material 403B is deposited with a different stoichiometry than the first dielectric material 403A to perform a stepwise grading of the dielectric material composition with each successive iteration of the deposition-anneal sequence.

A second iteration of the anneal operation 304 may then be performed to anneal the second dielectric material 403B. The second iteration may again include either or both anneal operations 305 and 306. Where $ND_3$ is employed in the second iteration of the anneal operation 304, deuterium is incorporated into the second dielectric material 403B to render a second deuterated layer 404B, depicted in FIG. 4E. In such an embodiment, because of the stepwise, iterative nature of the deposition-anneal sequence, the deuterium concentration profile across deuterated layers 404A and 404B is tunable. The deuterated layers 404A and 404B containing deuterium as-iteratively annealed may provide a relatively higher deuterium concentration at the interface of the tunneling layer as well as a deuterium concentration profile that is configurable to be other than that dictated by a single diffusion process. In one such embodiment, the deuterated layer has a substantially uniform deuterium concentration profile throughout the thickness of the first and second deuterated layers 404A and 404B. Notably, if deuterium was diffused from an external source after both first and second dielectric materials 403A and 403B were deposited (e.g. from an overlying deuterated ILD layer), the deuterium concentration would be graded continuously across the first and second dielectric material. Such a grading would disadvantageously render the lowest deuterium concentration nearest the tunneling layer interface and the highest deuterium concentration nearest the deuterium source (e.g. nearest an overlying deuterated ILD layer). It should also be appreciated these benefits described in the context of $ND_3$ anneals are also present with the other passivation species described elsewhere herein.

After the second iteration of the anneal operation 304, additional deposition-anneal iterations may be performed. In a particular embodiment, a third iteration may be performed to reach a cumulative thickness of oxygen-rich silicon oxynitride between approximately 2.5 nm and approximately 3.5 nm.

Figure 4F:
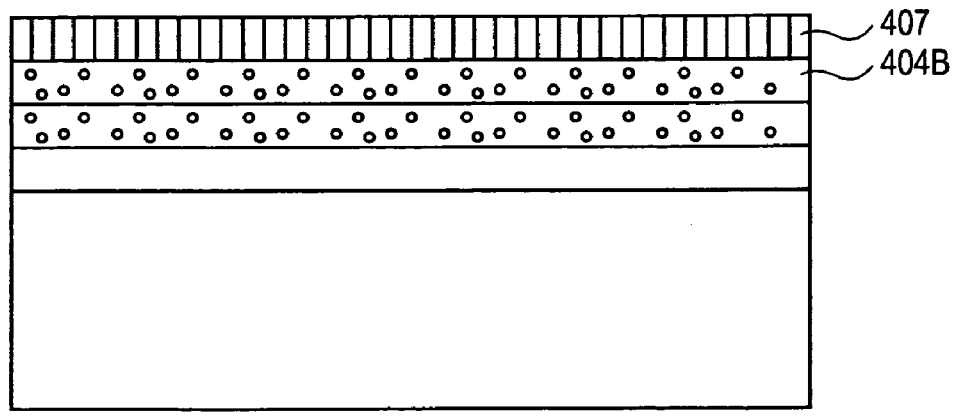
FIG. 4F illustrates a cross-sectional view representing operations in the formation of a semiconductor structure in which a dielectric material is deposited on the annealed dielectric material to complete formation of the charge trapping layer, in accordance with an embodiment of the present invention.
Figure 4G:
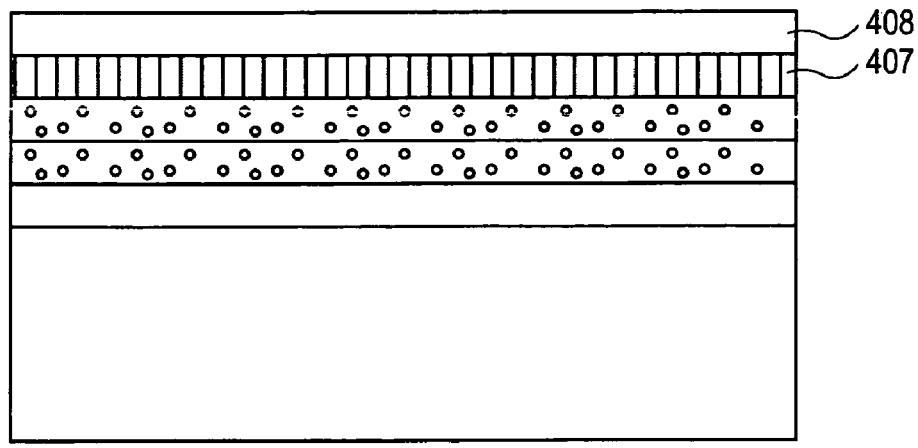
FIG. 4G illustrates a cross-sectional view representing operations in the formation of a semiconductor structure in which a blocking layer is formed on the charge trapping layer, in accordance with an embodiment of the present invention.

After a target thickness of anneal dielectric material is achieved, a thickness of a dielectric material which is not to be annealed may be deposited on the annealed layer(s). For example, as shown in FIG. 4F, a silicon-rich oxynitride layer 407 is deposited on the deuterated layer 404B. The silicon-rich oxynitride layer 407 may functionally serve as a charge trapping layer. In such embodiments, the silicon-rich oxynitride layer 407 provides a high density of charge traps by incorporating a greater amount of silicon than the oxygen-rich silicon oxynitride material annealed and/or deuterated. In a particular embodiment, the composition of the silicon-rich oxynitride results in the silicon-rich oxynitride layer 407 having an RI in the range of 1.9 and 2.1 and preferably about 2. In one such embodiment the silicon-rich oxynitride layer 407 has a thickness approximately in the range of 6-8 nm.

In an embodiment, the silicon-rich oxynitride layer 407 is formed by introducing a process gas mixture including $N_2O$, $NH_3$ and $SiH_2Cl_2$, while maintaining the chamber at a pressure approximately in the range of 5-500 mTorr, and maintaining substrate 400 at a temperature approximately in the range of 700-850° C., for a period approximately in the range of 2.5-20 minutes in a batch furnace. The process gas mixture includes $N_2O$ and $NH_3$ at a volumetric flow rate ratio from about 1:8 to about 1:4 ($N_2O:NH_3$) with $SiH_2Cl_2$ and $NH_3$ at a volumetric flow rate ratio from about 3.5:1 to 6:1 ($SiH_2Cl_2:NH_3$). In a preferred embodiment, the $N_2O$ and $NH_3$ are provided at a volumetric flow rate ratio of about 1:5. ($N_2O:NH_3$) while the $SiH_2Cl_2$ and $NH_3$ is at a volumetric flow rate ratio of about 4:1 ($SiH_2Cl_2:NH_3$). In certain embodiments, the gases are introduced at a flow rate approximately in the range of 5 to 200 sccm.

Referring back to the embodiment depicted in FIG. 3, at operation 308, a blocking layer of the of the non-volatile charge trap memory device is then formed to completed method 300. In accordance with the embodiment depicted in FIG. 4G, a blocking layer 408 is deposited over the charge trapping layer 407. Generally, a blocking layer may be of a material and have a thickness selected to maintain a sufficient barrier to charge leakage while minimizing reductions gate electrode capacitance. Any conventional means of forming the blocking layer 408 may be employed, such as, but not limited to high temperature oxidation (HTO) processes.

Figure 4H:
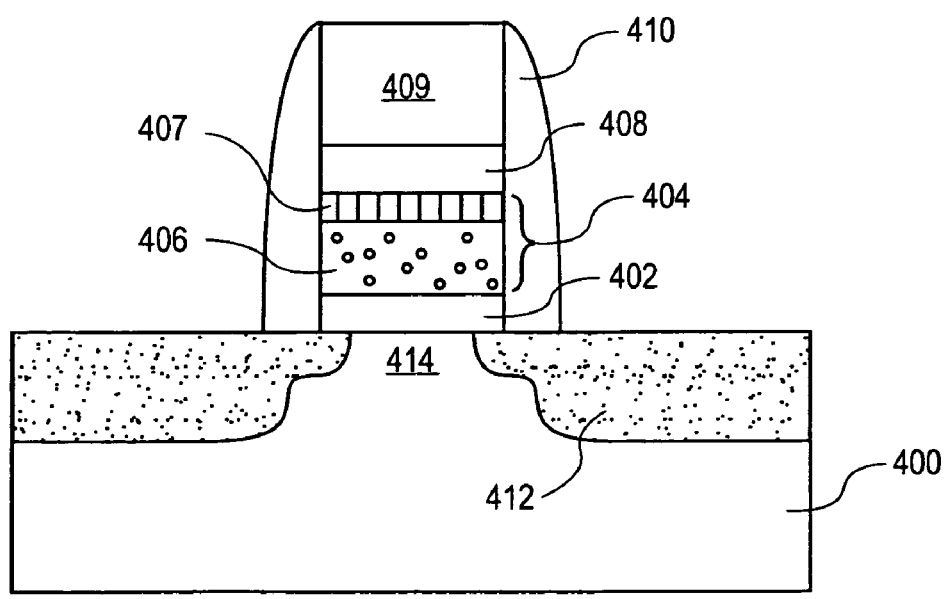
FIG. 4H illustrates a cross-sectional view of a non-volatile charge trap memory device incorporating a charge trapping layer including an non-annealed deposited dielectric layer on an annealed deposited dielectric layer, in accordance with an embodiment of the present invention.

FIG. 4H illustrates a cross-sectional view of a SONOS non-volatile charge trap memory device, in accordance with an embodiment of the present invention. Upon fabrication of an ONO stack including tunneling layer 402, charge trapping layer 404 and blocking layer 408, a non-volatile charge trap memory device may be fabricated to include a patterned portion of the ONO stack. Charge trapping layer 404 further includes an annealed oxygen-rich silicon oxynitride layer 406 and non-annealed silicon-rich silicon oxynitride layer 407. In the depicted embodiment, the oxygen-rich silicon oxynitride layer 406 has a higher deuterium concentration than that of the silicon-rich silicon oxynitride layer 407. In a further embodiment, the oxygen-rich silicon oxynitride layer 406 includes a substantially uniform deuterium concentration across the thickness of the annealed oxygen-rich silicon oxynitride layer 406.

The SONOS device includes a patterned portion of the ONO stack formed over a substrate 400. A gate layer 409 is disposed on the blocking layer 408. The non-volatile charge trap memory device further includes source and drain regions 412 in substrate 400 on either side of the ONO stack, defining a channel region 414 in substrate 400 underneath the ONO stack. A pair of dielectric spacers 410 isolates the sidewalls of tunneling layer 402, charge trapping layer 404, blocking layer 408 and gate layer 409.

Gate layer 409 may be composed of any conductor or semiconductor material suitable for accommodating a bias during operation of a SONOS-type transistor. In accordance with an embodiment of the present invention, gate layer 409 is formed by a chemical vapor deposition process and is composed of doped poly-crystalline silicon. In another embodiment, gate layer 409 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 412 may be any regions having opposite conductivity to channel region 414. For example, in accordance with an embodiment of the present invention, source and drain regions 412 are N-type doped regions while channel region 414 is a P-type doped region. In one embodiment, substrate 400 and, hence, channel region 414, is composed of boron-doped single-crystal silicon having a boron concentration in the range of $1\times10^{15}$-$1\times10^{19}$ atoms/cm$^3$. Source and drain regions 412 are composed of phosphorous- or arsenic-doped regions having a concentration of N-type dopants in the range of $5\times10^{16}$-$5\times10^{19}$ atoms/cm$^3$. In a specific embodiment, source and drain regions 412 have a depth in substrate 400 in the range of 80-200 nanometers. In accordance with an alternative embodiment of the present invention, source and drain regions 412 are P-type doped regions while channel region 414 is an n-type doped region.

Thus, an iterative deposition-anneal sequence forming an annealed portion of a charge trapping layer in a non-volatile charge trap memory device has been disclosed. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a non-volatile charge trap memory device, the method comprising:
   depositing on a tunneling single-layer, a first thickness of dielectric material;
   annealing the deposited first thickness of dielectric material;
   depositing on the annealed first thickness of dielectric material a second thickness of dielectric material, only the first and second thickness of dielectric material forming a charge trapping layer, wherein the first and second thickness are made of nitride; and
   forming, directly on the charge trapping dielectric material, a single blocking dielectric layer of the non-volatile charge trap memory device.

2. The method of claim 1, wherein the first thickness is between 1.0 nm and 1.5 nm.

3. The method of claim 1, wherein the annealing further comprises a first annealing process exposing the deposited first thickness to at least one of: ammonia ($NH_3$) or deuterated ammonia ($ND_3$), wherein at least one of the anneal process temperature or anneal process pressure is above that employed in the depositing of the first thickness of the first dielectric layer.

4. The method of claim 3, wherein the annealing further comprises a second annealing process exposing the deposited first thickness to nitrous oxide ($N_2O$), wherein at least one of the anneal process temperature or anneal process pressure is above that employed in the first annealing process.

5. The method of claim 3, wherein the annealing further comprises a second annealing process exposing the deposited first thickness to nitric oxide (NO) wherein at least one of the anneal process temperature or anneal process pressure is above that employed in the first annealing process.

6. The method of claim 1, wherein the anneal is performed in at least one of: a batch chamber for between 5 minutes and 10 minutes or a single substrate chamber for between 30 seconds and 60 seconds.

7. The method of claim 1, wherein the tunneling dielectric layer comprises silicon dioxide, the charge trapping dielectric layer comprises silicon oxynitride and the blocking dielectric layer comprises silicon dioxide to form a SONOS memory device.

8. A method of fabricating a non-volatile charge trap memory device, the method comprising:
    depositing on a tunneling single-layer, a first dielectric layer to a first thickness, the first dielectric layer having a first composition;
    annealing the deposited first thickness of dielectric material;
    depositing, on the annealed first dielectric layer a second dielectric layer, only the first and second dielectric layer forming a charge trapping layer, the second dielectric layer having a second composition, different than the first, wherein the first and second dielectric layers are made of nitride; and
    forming directly on the charge trapping layer a single blocking layer of the non-volatile charge trap memory device.

9. The method of claim 8, further comprising:
    depositing, on the annealed layer, a second thickness of the first dielectric layer; and
    annealing the deposited second thickness prior to depositing the second dielectric layer.

10. The method of claim 8, wherein depositing the first dielectric layer further comprises depositing an oxygen-rich silicon oxynitride layer and wherein depositing the second dielectric layer further comprises depositing a silicon-rich silicon oxynitride layer having a higher silicon concentration than the oxygen-rich silicon oxynitride layer.

11. The method of claim 10, wherein the first thickness of oxygen-rich silicon oxynitride deposited is between 1.0 and 1.5 nm and wherein the second thickness of oxygen-rich silicon oxynitride deposited is between 1.0 and 1.5 nm.

12. The method of claim 10, wherein the oxygen-rich oxynitride layer is deposited at a temperature between approximately 700° C. to approximately 850° C. with a process gas comprising $N_2O$ and $NH_3$ at a volumetric flow rate ratio from about 1:1 to about 3:1 with $SiH_2Cl_2$ and $NH_3$ at a volumetric flow rate ratio from about 3.5:1 to 8:1 and wherein annealing the deposited first thickness further comprises:
    exposing the deposited first thickness to a first annealing process comprising at least one of: ammonia ($NH_3$) or deuterated ammonia (ND3) at a temperature approximately in the range of 800° C. -900° C. and at a pressure approximately in the range of 250 mTorr to 2 Torr.

13. The method of claim 12, wherein the annealing further comprises exposing the deposited first thickness to a second annealing process and wherein at least one of the process temperature or process pressure in the second annealing process is above that employed in the first annealing process.

14. The method of claim 12, wherein the annealing further comprises exposing the deposited first thickness to a second annealing process comprising nitrous oxide.

15. The method of claim 12, wherein the annealing further comprises exposing the deposited first thickness to a second annealing process comprising nitric oxide (NO).

16. The method of claim 10, wherein the oxygen-rich, silicon oxynitride layer is deposited at a temperature between approximately 700° C. to approximately 850° C. with a process gas comprising $N_2O$ and $NH_3$ at a volumetric flow rate ratio from about 1:8 to about 1:4 with $SiH_2Cl_2$ and $NH_3$ at a volumetric flow rate ratio from about 3.5:1 to 6:1.

17. The method of claim 8, wherein the non-volatile charge trap memory device fabricated is a SONOS memory device.

* * * * *